United States Patent [19]

Ohgishi et al.

[11] 4,236,251

[45] Nov. 25, 1980

[54] FREQUENCY SYNTHESIZER RECEIVER HAVING MEMORY FOR STORING FREQUENCY DATA

[75] Inventors: Tsutomu Ohgishi, Hirakata; Toru Akiyama, Osaka; Tadashi Sakurai, Neyagawa, all of Japan

[73] Assignee: Sanyo Electric Co., Ltd., Moriguchi, Japan

[21] Appl. No.: 837,761

[22] Filed: Sep. 29, 1977

[30] Foreign Application Priority Data

Oct. 20, 1976 [JP] Japan ................................. 51-127652

[51] Int. Cl.² ............................................. H04B 1/26
[52] U.S. Cl. ................................... 455/180; 455/165; 455/183; 455/186
[58] Field of Search ............... 325/419, 420, 421, 418, 325/464, 470, 458, 459, 465, 469, 471, 452, 453, 457; 358/191, 192

[56] References Cited

U.S. PATENT DOCUMENTS

| | | | |
|---|---|---|---|
| 3,651,469 | 3/1972 | Keese | 325/470 |
| 3,882,400 | 5/1975 | Hamada | 325/455 |
| 3,965,336 | 6/1976 | Grohmann | 325/470 |
| 4,075,567 | 2/1978 | Klank et al. | 325/419 |
| 4,117,407 | 9/1978 | Kusakabe | 325/455 |

Primary Examiner—Marc E. Bookbinder
Attorney, Agent, or Firm—Darby & Darby

[57] ABSTRACT

A digital frequency synthesizer radio receiver, comprising a scan memory for storing a digital value data concerning a broadcasting frequency; a digital value data entry device for selectively entering a digital value concerning a broadcasting frequency; a preset memory having a plurality of storing locations, each adapted for storing a digital value concerning a specified broadcasting frequency, a channel selector coupled to said preset memory for selecting one of said storing locations thereof, said preset memory being responsive to said channel selector and said digital value data entry device for loading the entered digital value data in the location of the preset memory selected by the channel selector; and a phase locked loop selectively and operatively coupled to either of said scan memory and said preset memory for providing an oscillation frequency signal the frequency of which is associated with the digital value data loaded in the selected one of said scan memory and the preset memory. Preferably, said scan memory comprises a plurality of memories, each allotted for a frequency band, and said preset memory is structured such that each location comprises a plurality of regions, each allotted for a frequency band, whereby a multiband frequency synthesizer radio receiver is provided.

21 Claims, 5 Drawing Figures

FREQUENCY SYNTHESIZER RECEIVER HAVING MEMORY FOR STORING FREQUENCY DATA

BACKGROUND OF THE INVENTION

1. Field of the Invention

The present invention relates to a digital frequency synthesizer receiver. More specifically, the present invention relates to such a radio receiver employing a storage for storing information concerning a broadcasting frequency signal.

2. Description of the Prior Art

Radio receivers of the digital frequency synthesizer type have been proposed and put in practical use. Briefly, a digital frequency synthesizer radio receiver is structured to obtain a local oscillation signal from a phase locked loop. A phase locked loop typically comprises a reference oscillator the oscillation frequency of which is $f_r$, a voltage controlled oscillator for providing an output signal the frequency of which is $f_o$, a frequency divider for dividing the output from the voltage controlled oscillator at the rate of frequency division of 1/N, a phase comparator for comparing the output from the reference oscillator and the output from the frequency divider, and a low pass filter for filtering the voltage signal proportional to the phase difference between the reference oscillator output and the frequency divider output for feeding back the filtered direct current output to the voltage controlled oscillator, whereby in a stabilized or locked state of the above described feedback loop the relation between the oscillation frequency $f_o$ of the voltage controlled oscillator and the oscillation frequency $f_r$ of the reference oscillator becomes $f_o = N \cdot f_r$. Thus, in a conventional frequency synthesizer radio receiver, for the purpose of varying the local oscillation frequency, control is accomplished to vary the rate of frequency division by the frequency divider. The frequency divider to be employed for that purpose is normally called a programmable counter.

In a conventional digital frequency synthesizer radio receiver, a scanning operation of receiving frequencies was achieved by providing a scan counter in parallel with a programmable counter such that the scan counter is supplied with a scanning pulse. Since the contents in the scan counter are sequentially changeable upon application of a scanning pulse to the scan counter, the contents in the programmable counter are changed responsive to the output from the scan counter, whereby the rate of frequency division by the programmable counter is changed accordingly.

SUMMARY OF THE INVENTION

Briefly described, the present invention is aimed to replace a scan counter with a scan memory in a conventional digital frequency synthesizer receiver wherein a scan counter is provided in parallel with a programmable counter. More specifically, the scan memory is loaded with information concerning a broadcasting frequency the reception of which is desired, and the data loaded in the scan memory is set to a programmable counter provided to form a phase locked loop. In such an implementation, a scanning operation of the receiving frequency can be achieved by changing the data loaded in the scan memory, thereby to vary the rate of frequency division by the programmable counter.

Preset selection of station can also be achieved in such an implementation wherein the data loaded in a preset memory is set in a programmable counter constituting a phase locked loop. For the purpose of preset selection of a station, the preset memory is provided separately in order to store in advance information concerning a desired specified broadcasting frequency. In the operating mode of preset selection of a station, desired data is read out from the preset memory and is set in the programmable counter constituting a phase locked loop, whereby the desired station is immediately selected.

A preferred embodiment of the present invention may be structured such that turning on of a power supply of the radio receiver after a given broadcasing station was once selected by preset selection of a station and the power supply was then turned off enables selection of the same station that was received before the power supply was turned off. To that end the same and/or preset memories may each comprise a non-volatile memory.

In practicing the present invention in a multiband radio receiver, a plurality of scan memories are preferably provided corresponding to the respective frequency bands.

As described above, according to the present invention, a frequency synthesizer is structured such that informtion concerning a broadcasting frequency, the reception of which is desired, is obtained from a non-volatile memory rather than a conventional scan counter operable in response to a clock pulse. Therefore, such information can be entered with ease by the use of any type of digital value entering apparatuses, such as a digital switch, a ten-key keyboard, or the like.

Another aspect of the present invention is employment for selective use of a non-volatile present memory for storing information concerning a specified broadcasting frequency as well as a non-volatile scan memory for storing information concerning a broadcasting frequency to be received in a normal station selecting mode, such that information concerning a broadcasting frequency is applied to a frequency synthesizer. Therefore, there is no fear that information stored in the preset memory will be destroyed in the normal station selecting mode. If only a plurality of preset memories had been provided and a specified one of them had been assigned to an ordinary station selecting mode only, then the said specified preset memory must have always been selected in an ordinary station selecting mode, and an erroneous selection of a preset memory for the purpose of the ordinary station selecting mode could have destroyed the information preset in the said memory. The present invention avoids such a problem.

Another aspect of the present invention is the provision of a plurality of scan memories corresponding to a plurality of frequency bands in a multiband frequency synthesizer radio receiver such that information concerning a broadcasting frequency is applied from a selected one of the plurality of scan memories to the frequency synthesizer. Therefore, the present invention can avoid a disadvantage that when the band is switched from the AM band to the FM band, for example, the digital numerical value set in the AM band scan memory comes outside the range of the FM band frequencies.

A further aspect of the present invention is an implementation wherein a preset memory for storing information concerning a desired broadcasting frequency as well as a scan memory for storing information concerning a broadcasting frequency to be received in an ordinary station selecting mode is provided and in a preset station selecting mode the information read out from the preset memory is once written in the scan memory. Such a structure ensures that when a power supply is turned on even after a given broadcasting frequency was received in a preset station selecting mode and thereafter the power supply was turned on, whereupon the information concerning the broadcasting frequency is obtained from the scan memory and is applied to a phase locked loop, the same station that was received before the power supply was turned off is again received even after the power supply is turned on again.

Therefore, a principal object of the present invention is to provide a frequency synthesizer receiver operable responsive to digital data.

Another object of the present invention is to provide a frequency synthesizer receiver operable responsive to entered digital data concerning a broadcasting frequency, wherein entry of data concerning a broadcasting frequency is facilitated.

A further object of the present invention is to provide a frequency synthesizer receiver operable responsive to entered digital data concerning a broadcasting frequency, wherein digital data concerning a desired broadcasting frequency to be received in a preset station selecting mode and digital data concerning a broadcasting frequency to be received in a normal scanning station selecting mode are entered in separate memories.

Still a further object of the present invention is to provide a frequency synthesizer receiver operable responsive to entered digital data concerning a broadcasting frequency, wherein digital data concerning broadcasting frequencies for a plurality of frequency bands can be entered in corresponding separate memories.

Still another object of the present invention is to provide a frequency synthesizer receiver operable responsive to entered digital data concerning a broadcasting frequency, wherein in a preset station selecting mode the information read out from a preset memory is applied to a phase locked loop, while the same is written in a scan memory.

These objects and other objects, features, aspects and advantages of the present invention will become more apparent from the following detailed description of the present invention when taken in conjunction with the accompanying drawings.

DESCRIPTION OF THE PREFERRED EMBODIMENTS

As described previously, the present invention is directed to a frequency synthesizer receiver, such as a radio receiver, operable in response to entered digital data concerning a broadcasting frequency, wherein entry of data concerning a broadcasting frequency is facilitated. Therefore, first of all description will be made of how digital data concerning a broadcasting frequency is entered in a scan memory.

Typically, digital values are loaded or preloaded in a digital memory such as a core memory, a semiconductor memory or the like in digital electronic equipment. Various methods for loading the data or digital values in such a digital memory have been proposed. Typical such methods comprise a digital switch, a ten-key keyboard, or the like. In a preferred embodiment of the present invention, however, a new type of entry apparatus of a digital value is employed wherein a changeable digital numerical value generated in a counter is selectively loaded in a digital memory. Briefly described, the said new type of entry appratus comprises a counter for repetitively providing the digital numerical value in a given range at a given rate, a digital memory adapted to be loaded with the digital numerical value in the counter responsive to a load enable signal and a load enable signal generator for generating a load enable signal to the digital memory at the same rate as that of the counter such that the timing of the load enable signal is manually adjustable, whereby manual operation of the load enable signal generator for adjusting the timing of the load enable signal allows the numerical value in the counter at the timing to be loaded in the digital memory.

Figure 1:
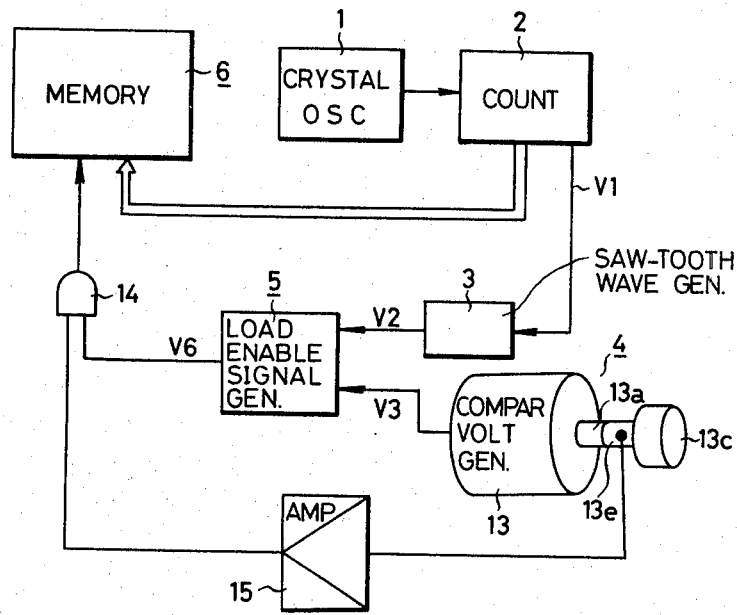
FIG. 1 shows a block diagram of a digital value entry circuit for entering information concerning broadcasting frequencies in a memory of the present invention.

Referring to FIG. 1, a block diagram of such a new type of a digital value entry apparatus is shown. The reference signal output from a reference oscillator 1, which may comprise a crystal controlled oscillator, is applied to a counter 2 where the reference signal is counted to provide a count output as a changeable digital value. A saw-tooth wave generator 3 is provided so as to generate a saw-tooth wave such that the saw-tooth wave is changeable in synchronism with the counter output. A comparison voltage generator 4 is also provided which may typically comprise a variable resistor, or potentiometer 13. A load enable signal generator 5 is provided to receive the saw-tooth wave output from the saw-tooth wave generator 3 and the comparison voltage output as set in the comparison voltage generator 4. The load enable signal generator 5 is structured to compare the saw-tooth wave output and the comparison voltage output to provide a load enable signal whenever both outputs coincide with each other. A digital memory 6 is provided to be responsive to the load enable signal from the load enable signal generator 5 to load therein the count output in the counter 2 which has been attained when the load enable signal is produced.

Figure 2:
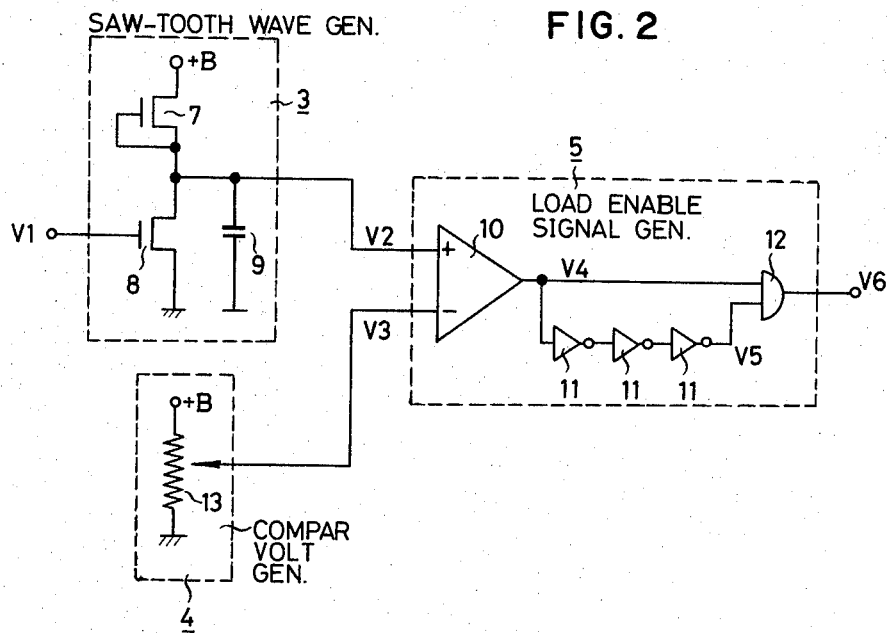
FIG. 2 shows a schematic diagram of one embodiment of the saw-tooth wave generator and the enable pulse generator shown in FIG. 1.
Figure 3:
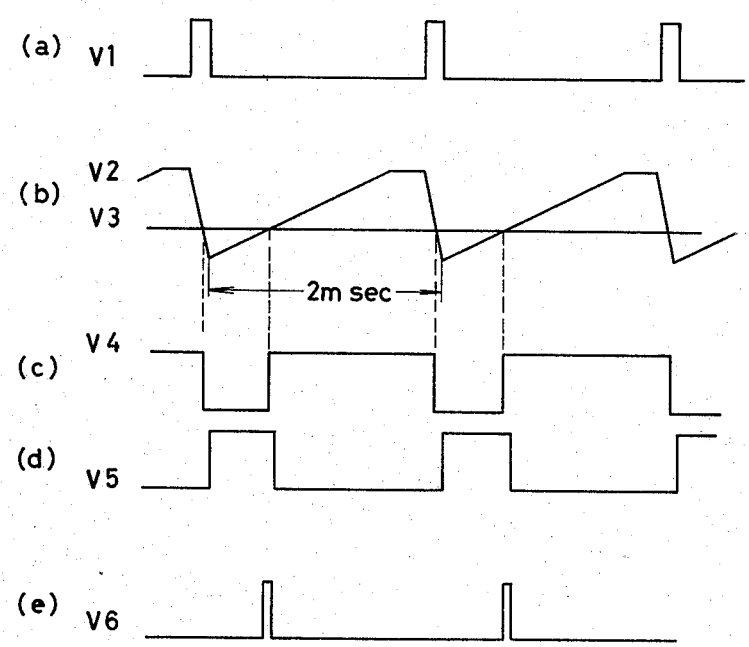
FIG. 3 shows wave forms of various signals at several portions in the FIG. 2 diagram.

Referring to FIG. 2, a schematic diagram of the saw-tooth wave generator 3 and the load enable signal generator 5 is shown. Referring to FIG. 3, wave forms of the signals at various portions in the FIG. 2 diagram are shown. Referring to FIG. 2, the saw-tooth wave generator 3 comprises two series connected insulated gate field effect transistors 7 and 8 and a capacitor 9 connected in parallel with the transistor 8. The load enable signal generator 5 comprises a voltage comparator 10 implemented by a differential amplifier, three series connected inverters 11 connected from the output of the voltage comparator 10, and an AND gate 12 connected to receive the output of the voltage comparator 10 and the output of the series connected inverters 11. The reference oscillator 1 is structured to oscillate at, for example, an oscillation frequency of 1 MHz. The counter 2 is structured to be responsive to the reference signals from the reference oscillator 1 to make a repetitive counting operation of the number 2000 from 0 to 1999. The counter 2 is structured to provide a carry output signal V1 (see FIG. 3 (a)), whenever the count value changes from 1999 to 0. The carry output signal V1 is applied to the gate electrode of the insulated gate field effect transistor 8. Therefore, each time the carry output signal V1 is applied to the gate electrode of the transistor 8, the transistor 8 becomes conductive to instantaneously discharge the electric charge in the capacitor 9 through the transistor 8. After the transistor 8 returns to a non-conductive state, a current flows through the transistor 7 to the capacitor 9, whereby the capacitor 9 is charged at a time constant determinable by the resistance value of the transistor 7 and the capacitance value of the capacitor 9. When the carry output signal V1 is applied from the counter 2 to the gate electrode of the transistor 8, again the charge stored in the capacitor 9 is instantaneously discharged. Thus, the output V2 of the saw-tooth wave generator 3 exhibits a change as shown in FIG. 3(b) in synchronism with the output V1 from the counter 2. Since the oscillation frequency 1 MHz from the reference oscillator 1 is frequency divided by the counter 2 to 1/2000, the frequency of the carry output signal V1 becomes 500 Hz. As a result, the saw-tooth wave generator 3 provides a saw-tooth wave which is changeable in synchronism with the output V1 from the counter 2 at rate of every 2 milliseconds.

Although in the foregoing description the saw-tooth wave generator 3 was described as providing the output wave form changeable in synchronism with a carry output signal obtainable from the counter 2, any other signal representative of the repetitive change of the count value in the counter may be utilized.

The output V2 from the saw-tooth wave generator 3 is applied to one input to the voltage comparator 10 and the output V3 from the comparison voltage generator 4 (see FIG. 3(b)) is applied to the other input to the voltage comparator 10. Therefore, the output V4 from the voltage comparator 10 assumes a low level if and when the output V2 is smaller than the output V3 and assumes a high level if and when the output V2 is larger than the output V3 (see FIG. 3(c)). The output V4 from the voltage comparator 10 is directly applied to one input of the AND gate 12. On the other hand, the output V4 from the voltage comparator 10 is inverted and delayed through the three series connected inverters 11 and the output V5 thus obtained (see FIG. 3(d)) is applied to the other input of the AND gate 12. Referring to FIG. 3, if and when both the outputs V4 and V5 are at the high level, the output V6 from the AND gate 12 also assumes the high level, which is withdrawn as a load enable signal and is applied to the memory (see FIG. 3(e)). From the foregoing description, it would be appreciated that by changing the voltage value of the comparison voltage V3 through manual operation of the variable resistor 13 the timing of the load enable signal can be adjusted, and as a result any desired value within the range of "0" to "1999" as counted in the counter 2 which is repeated at the rate of every 2 milliseconds can be selected by manually adjusting the variable resistor 13 and the same can be loaded in the memory 6.

It is pointed out that although in the above described embodiment the variable resistor 13 was adjusted to change the comparison voltage V3 for the purpose of changing the timing of the load enable signal, the timing of the load enable signal can be adjusted by using a variable capacitor as the capacitor 9 in the saw-tooth wave generator 3 and by changing the gradient of the saw-tooth wave through a change of a capacitance value, with the comparison voltage kept constant, as seen in the dotted line in FIG. 3.

From the foregoing description, it should be appreciated that the saw-tooth wave generator 3 was employed to provide a signal of a wave form having a ramp portion for providing a gradually changing voltage which is to be compared with the comparison voltage V3 and the linearity of the said ramp portion is not vitally important to the present invention. Therefore, the charging current for the capacitor 9 need not necessarily be a constant current. Therefore, the transistor 7 having a constant current characteristic may be replaced by a resistor. Alternatively, the transistor 7 may be replaced by a variable resistor so that adjustment of the variable resistor enables adjustment of the wave form of the output from the saw-tooth wave generator 3. In the following, therefore, the embodiment is described by taking an example wherein the comparison voltage V3 is adjusted through adjustment of a variable resistor, as shown in FIG. 2.

It is further pointed out that if a relatively higher numerical value of the output from the counter 2 such as the numerical value in the vicinity of 1999 need not be written in the memory, the wave form of the saw-tooth output from the saw-tooth wave generator may be distorted to some extent at the end portion of the ramp region, that is, the saw-tooth wave form may be similar to trapezoid. In this context, the term "ramp wave signal" is adopted to broadly cover a saw-tooth wave, a trapezoidal wave, sine wave, and the like for the purpose of the present invention.

As described above, the embodiment shown and described in the foregoing is adopted to repetitively provide from the counter 2 the digital value of "0" to "1999" at the rate of every 2 milliseconds. Now let it be assumed that a given digital value output, say 1000, of the counter 2 is loaded in the memory 6 by manually adjusting the variable resistor to adjust the timing of the load enable signal. Then, the memory 6 is repetitively loaded with the digital value "1000" at the rate of every 2 milliseconds. However, after once a desired value is loaded in the memory 6, the same value need not be repetitively loaded in the memory 6. Conversely, if the apparatus had been adapted to be kept repetitively loaded with the same value even after the desired value is once loaded, then a slight fluctuation of the timing of the load enable signal because of fluctuation of the source voltage could cause a slight deviated digital value such as the values "1001", "999" or the like to be reloaded with respect to the desired value "1000". In order to avoid such shortcomings, the apparatus may be structured such that after a desired numerical value is loaded in the memory further load enable signals are prevented from being applied to the memory, while the load enable signal is allowed to be applied to the memory only if a desired numerical value is to be loaded in the memory.

Referring again to FIG. 1, the embodiment shown comprises an improvement to that end, wherein upon manual touching of a knob, in an attempt to adjust a variable resistor, a touch switch is enabled responsive to the touching thereby to allow the load enable signal to be applied to the memory. More specifically, the variable resistor 13 comprises a shaft which comprises an insulated portion 13a and a metal portion 13e, the metal portion 13b being connected to a conductive knob 13c. The metal portion is connected through an amplifier 15 to one input of an AND gate 14 the other input of which is connected to receive the output V6 from the load enable signal generator 5. The output from the AND gate 14 is applied to the memory 6 as a load enable signal. If and when the knob 13c is touched by a hand in an attempt to operate the variable resistor 13, a capacitance of several tens pF of the human body with respect to the ground causes the amplifier 15 to provide a high level output, which amplifier normally provides the low level output. As a result, a AND gate 14 is enabled and the load enable signal is allowed to pass through the AND gate 14 to be applied to the memory 6, whereby the memory 6 is enabled to load the new numerical value from the counter 2. If the knob 13c is not touched by the finger, the output from the amplifier 15 assumes a low level and the AND gate 21 is disabled, whereby the load enable signal is prevented from being applied to the memory 6.

In the above described embodiment, a touch switch for detecting the change of the capacitance value occurring upon touching of the hand on a knob was utilized. Alternatively, however, a pressure sensitive type touch switch for detecting a pressure occurring upon touch of the hand of the knob, or a short circuit type touch switch adapted for short circuiting through the human body upon touching of the hand of the knob, or the like may be utilized.

Figure 4:
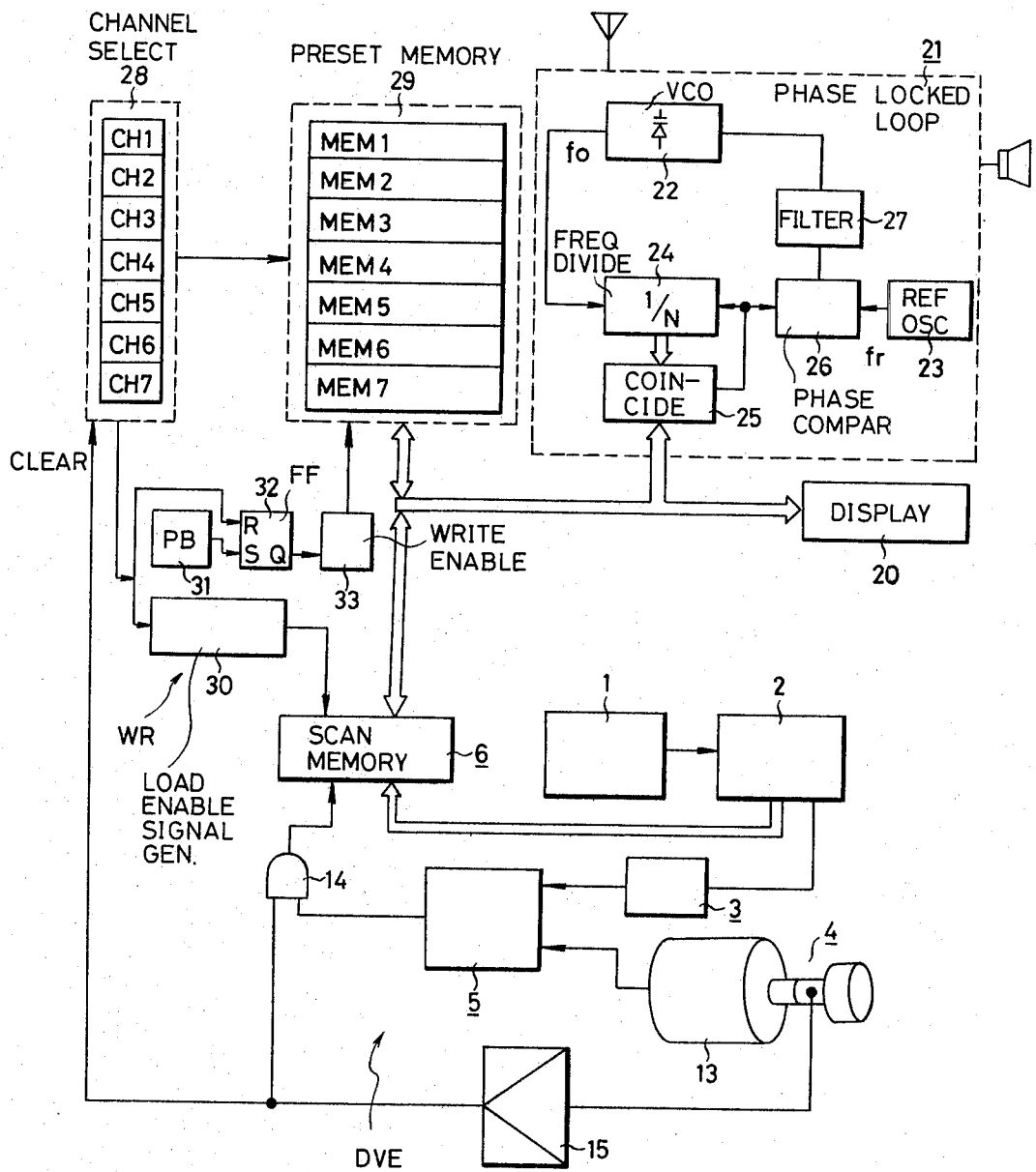
FIG. 4 shows a block diagram of the inventive memory for a single band type.

FIG. 4 is a block diagram of a frequency synthesizer radio receiver employing a memory for storing information concerning a broadcasting frequency combined with the above described digital value entry apparatus. As is well known, a radio receiver of a digital frequency synthesizer is structured to obtain a local oscillation output from a phase locked loop. A phase locked loop comprises a circuit configuration wherein the output from a reference oscillator oscillating at frequency $f_r$ and the output of a frequency $f_o$ from a voltage controlled oscillator, as frequency divided by a frequency divider of the frequency division rate 1/N, are compared by a phase comparator, a voltage signal proportional to the phase difference is withdrawn by a low pass filter in the form of a direct current output, the direct current output is fed back to the voltage controlled oscillator, whereby in a steady state, i.e. a phase locked state of the feedback loop, a relation of the oscillation frequency of the voltage controlled oscillator and the oscillation frequency of the reference oscillator achieves the relation $f_o = N \cdot f_r$. Thus, it would be appreciated that a change of the local oscillation frequency in a frequency synthesizer receiver can be achieved by varying the frequency division rate of a frequency divider.

Referring to FIG. 4, the receiver is shown comprising a phase locked loop 21 combined with the above described digital value entry apparatus and a nonvolatile preset memory 29, a channel selector 28, a display 20 and the like. Since the digital value entry apparatus DVE is of the same structure as discussed in FIG. 1, the same portions have been denoted by the same reference characters. The memory 6 is also preferably a non-volatile type, and is used as a scan memory, as to be described subsequently.

Referring to FIG. 4, the receiver is shown comprising a voltage controlled type local oscillator 22 including a variable capacitance diode. The output from the voltage controlled oscillator 22 is applied to a frequency divider called a programmable counter 24 which comprises a counter, a count up value of which is controllable such that a frequency division rate associated with a receiving frequency can be set. The count output in the counter 24 is applied to a coincidence circuit 25 which is also connected to receive a stored digital value from the scan memory 6. The coincidence circuit 25 is structured to compare the count output from the counter 24 with the stored digital value from the scan memory 6 to provide a pulse to the phase comparator 26 whenever coincidence of the count output from the counter 24 and the stored digital value from the scan memory 6 is achieved and simultaneously provides a reset pulse to the counter 24 to reset the same. The output from the coincidence circuit 25 is applied to one input of a phase comparator 26, the other input of which is connected to receive a reference frequency signal from a reference oscillator 23 which oscillates at the frequency $f_r$. The frequency of the output from the coincidence circuit 25 and the reference frequency of the reference frequency signal are compared by the phase comparator 26 to provide an output signal proportional to the difference of these two frequencies. The output from the phase comparator 26 is smoothed by a low pass filter 27 and is then applied to the local oscillator 22 as a control voltage. In order to display the digital value stored in the scan memory 6, a digital display 20 is provided which may comprise light emitting diodes, as well known to those skilled in the art.

The preset memory 29 comprises a plurality of addresses MEM1 to MEM7, each adapted to store digital data concerning a broadcasting frequency to be written from the scan memory 6 and to provide the same to the coincidence circuit 25. The channel selector 28 also comprises a corresponding plurality of sections CH1 to CH7 for selecting one of the addresses in the preset memory 29. A writing circuit WR is operatively coupled to the channel selector 28, preset memory 29 and the memory 6. The write circuit WR comprises a load enable signal generator 30, a push button 31, a flip-flop 32 and a write enable signal generator 33 connected as shown.

First of all, a description will be made of an ordinary station selecting mode, wherein a desired broadcasting station is selected as a result of scanning operation. To that end, first the timing of the generation of a load enable signal is adjusted by manual operation of the variable resistor 13 and a digital value concerning the broadcasting frequency of a desired station is loaded in the scan memory 6. For example, assuming that an AM broadcasting station of the frequency 1010 KHz is to be selected, the variable resistor 13 is adjusted such that the digital data "1010" is loaded in the scan memory 6. The data stored in the scan memory 6 is applied to the frequency display 20 to display the same and is also applied to the coincidence detector 25 of the phase locked loop 21. Assuming further that the above described AM broadcasting station of the frequency 1010 KHz is received by an upper superheterodyne system, the oscillation frequency of the voltage controlled oscillator 22 forming the local oscillator must be 1465 KHz, the intermediate frequency being 455 KHz. Assuming that the reference frequency is 1 KHz, therefore, the phase locked loop 21 is stabilized if and when the frequency division rate N of the programmable counter 24 becomes 1465. In such a situation, the voltage controlled oscillator 22 oscillates at a frequency of 1465

KHz. For the purpose of making the programmable counter 24 operate at the frequency division rate 1465, the data in the scan memory 6 is applied to one input of the coincidence circuit 25 and the output from the programmable counter 24 is applied to the other input of the coincidence circuit 25, while the programmable counter 24 is adapted such that the same operates as an up counter making a count up operation starting from an initial set value 1545 which is the complement of the value 455 of the intermediate frequency (2000−455=1545). Therefore, the programmable counter 24 makes a count up operation starting from the initial value 1545, and when the numerical value 1010 is counted thereby, coincidence is achieved by the coincidence circuit 25, whereby a coincidence signal is obtained to reset the programmable counter 24 to the initial value 1545, while the coincidence signal is also applied to the phase comparator 26. As the above described operation is repeated, the programmable counter 24 functions as a frequency divider a frequency division rate of which is 1/1465.

Assuming an FM broadcasting signal of for example a frequency 76.0 MHz is received in accordance with a lower superheterodyne system, the local oscillation frequency must be 65.3 MHz. The local oscillation frequency 65.3 MHz is frequency divided in advance at a given frequency division rate 1/100 by means of another frequency divider called a prescaler, not shown, to provide a signal of a frequency 653 KHz, whereby comparison is made with the reference frequency 1 KHz. In such a situation, the programmable counter 24 must function at a frequency division rate of 1/653. Therefore, the programmable counter 24 is preset to a preset numerical value 107 corresponding to the intermediate frequency 10.7 MHz, so that the progammable counter 24 operates as an up counter making a counting operation starting from the above described initial preset value 107. Then a coincidence output is obtained from the coincidence circuit 25, if and when the numerical value 760 is counted by the programmable counter 24, whereupon the programmable counter is reset to the initial value 107. Thus, the programmable counter 24 functions as a frequency divider the frequency division rate of which is 1/653.

As described in the foregoing, according to the present invention, the data concerning the broadcasting frequency of a desired broadcasting station can be loaded in the scan memory 6 merely through manual operation of the variable resistor 13, and the said data is applied to the phase locked loop 21 to provide a prescribed local oscillation output, thereby to enable reception of the desired broadcasting station.

If the scan memory 6 is implemented by a non-volatile type memory, the data is kept stored even after the power supply of the radio receiver is turned off. Therefore, even after the power supply is turned on again after once a desired broadcasting station is selected and then the power supply is turned off, the same broadcasting station that was selected before the power supply was turned off can be automatically selected responsive to the data kept stored in the scan memory 6. In the context, it is intended that a non-volatile memory comprises a memory which is non-volatile by virtue of its own structure but also a memory that is capable of storing the data through energization by a separate power supply even if the power supply of the radio receiver is turned off.

Now a description will be made of a preset station selecting mode. To that end, the channel selector 28 is operated to select one channel of the desired broadcasting station. The channel selector 28 is preferably implemented by a touch switch. The preset memory 29 is responsive to the output from the channel selector to select the corresponding address, whereupon the data stored in the address is read out and is applied to the coincidence circuit 25 of the phase locked loop 21 and is also applied to the frequency display 20. Accordingly, the desired broadcasting station is selected and the frequency thereof is displayed. Operation of the channel selector 28 also causes the load enable signal generator 30 to be enabled, whereby a load enable signal is obtained from the generator 30 and is applied to the memory 6. As a result, the data stored in the address as selected by the channel selector 28 that is read out as described previously is also applied to the scan memory 6 and is loaded therein. Therefore, even after the power supply is turned on after once a desired broadcasting station was selected by the preset station selecting mode and the power supply was turned off, whereupon the information concerning the broadcasting frequency is obtained from the same memory and is applied to the phase locked loop, the same broadcasting station that was received before the power supply was turned off can be again selected.

If and when the knob of the variable resistor 13 is touched by way of the ordinary station selecting mode after once a desired station is selected in the preset station selecting mode, the output from the amplifier 15 becomes the high level and the channel selector 28 is cleared, whereby the apparatus is switched from the preset station selecting mode to the ordinary station selecting mode.

If the channel selector 28 is structured to keep an operating state of the selected channel even after the power supply is turned off so as to provide the same station selection signal even after the power supply is turned on again, then it is not necessary to load again the data read from the corresponding address in the preset memory into the scan memory 6.

Now a description will be made of how the data concerning the broadcasting frequency is written into the preset memory 29. To that end, first of all the variable resistor 13 is operated to select a desired broadcasting station which is to be preset. When the desired station is selected through operation of the variable resistor 13 by way of the ordinary station selecting mode, the digital data concerning the broadcasting station of the said desired broadcasting station is generated and loaded in the scan memory 6. For the purpose of writing the same into the preset memory 29, the push button 31 is operated, whereby the flip-flop 32 is set. Then the channel selector 28 is operated to select a channel wherein it is desired to write the said data. Then the flip-flop 32 is reset. The write enable signal generator 33 is responsive to the shift of the flip-flop 32 from the set state to the reset state to generate a write enable signal. The preset memory 29 are responsive to the channel selection signal from the channel selector 28, whereby the corresponding memory address is selected and is ready for writing operation. As a result, the preset memory 29 is responsive to the write enable signal from the generator 33 and the data loaded in the scan memory 6 is written in the corresponding selected address of the preset memory 29. The write enable signal is adapted to be of the pulse width of $0.1\mu$ seconds to 1μ seconds. After the data is written in the preset memory 29 as a function of the write enable signal, the data is read out from the address in the preset memory 29 and is applied to the phase locked loop 21.

Figure 5:
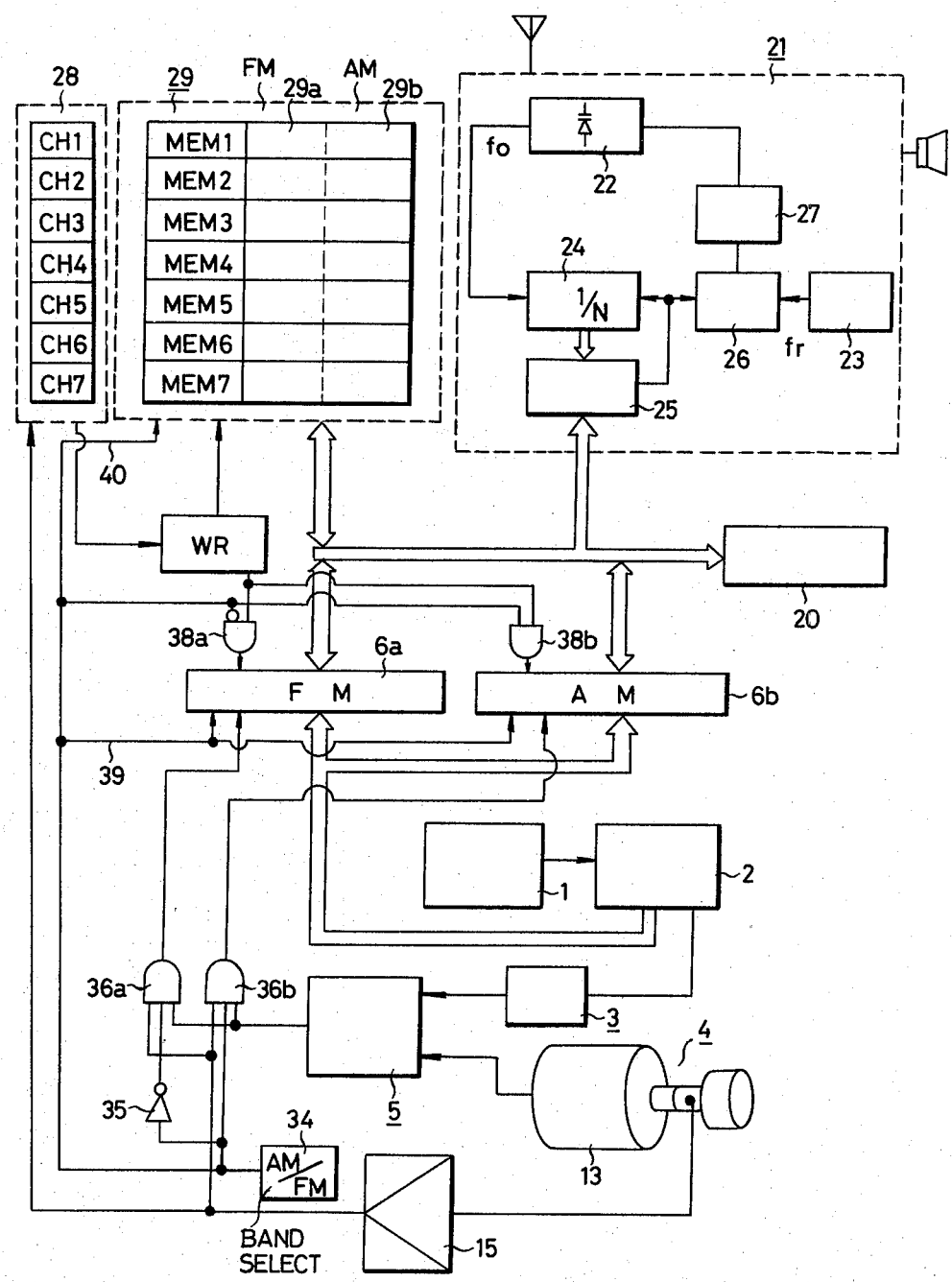
FIG. 5 shows a block diagram of the inventive memory for a 2-band type.

Now referring to FIG. 5, a block diagram of another embodiment of the present invention is shown, wherein the present invention is embodied in a multiband frequency synthesizer radio receiver. The embodiment is shown comprising a 2-band frequency synthesizer radio receiver covering the AM band and FM band. For the purpose of selection of the frequency band, a band selector 34 is provided. The band selector 34 is structured such that when the FM band is selected the selector 34 provides a low level output and when the AM band is selected the selector 34 provides a high level output. Similarly, the scan memory comprises an FM band scan memory 6a and an AM band scan memory 6b. Several components have been added to select the FM or AM band scan memory 6a or 6b responsive to the selection output from the band selector 34. Such additional components will be described in conjunction with the operation of the embodiment shown. Since the remaining portions of the embodiment shown are the same as discussed in the FIG. 4 embodiment, it is not believed necessary to describe the same again in detail.

Now consider a case where the FM band is selected by the band selector 34. Then the selector 34 provides a low level output as described previously. The low level output from the band selector 34 is inverted by an inverter 35 and is applied to an AND gate 36a. Thus selection of the FM band enables the AND gate 36a, such that the load enable signal from the load enable signal generator 5 is allowed to be applied to the FM band scan memory 6a. Similarly, if and when the channel selector 28 is operated to select one of the channels, the write circuit WR is enabled to provide a load enable signal, which is applied through an AND gate 38a to the FM band scan memory 6a. The low level output from the band selector 34 representative of selection of the FM band is applied through the band selection signal line 39 to the FM band scan memory 6a to enable the same, while the high level output from the band selector 34 representative of selection of the AM band is applied through the band selection signal line 39 to the AM band scan memory 6b to enable the same. Similarly the low level output from the band selector 34 representative of selection of the FM band is applied through a band selection signal line 40 to the preset memory 29 to select the FM band region 29a, while the high level output from the band selector 34 representative of selection of the AM band is applied through the band selection signal line 40 to the preset memory 29 to select the AM band region 29b. Thus selection of the FM band by means of the band selector 34 enables the FM band scan memory 6a and the FM band memory region 29a in the preset memory 29. On the other hand, if and when the AM band is selected by the band selector 34, the high level output is obtained from the band selector 34 and is applied through AND gates 36b and 38b, so that the AM band scan memory 6b and the AM memory region 29b in the preset memory 29 are enabled.

For consideration of the operation of the embodiment shown, let it be assumed that first the broadcasting frequency 830 KHz of the AM frequency band is selected in the ordinary station selection mode and the data therefor is loaded in the AM band scan memory 6b as "830" whereupon the band is switched from the AM band to the FM band and the broadcasting frequency 85.1 MHz of the FM broadcasting band is selected by the ordinary station selecting mode and the data therefor is loaded in the FM band scan memory 6a. Considering a case where the band is switched from the FM band to the AM band in such a situation, then the broadcasting frequency 830 KHz of the data 830 stored in the AM band scan memory 6b is regained and accordingly the station of the broadcasting frequency 830 KHz is selected, inasmuch as the memories 6a and 6b have been structured in a non-volatile form.

The same applies to the preset station selection mode. Let it be assumed that the data 851 has been stored in the FM band memory region 29a at the address MEM2 in the preset memory 29 and the data 830 has been stored in the AM memory region 29b at the address MEM2 in the preset memory 29. Considering a case where the channel number 2 has been selected by the channel selector 28, the broadcasting station of the frequency 830 KHz is selected when the AM band is selected and the broadcasting station of the frequency 85.1 MHz is selected when the FM band is selected. Either of these stations may be selected only depending on the selection of the frequency band, provided that channel number 2 has been selected by the channel selector 28.

The embodiment shown may be structured such that in the preset station selecting mode the data as read from the preset memory 29 is once loaded in the scan memory and the preset selection of the station is cleared responsive to the band selection while the data is obtained from the scan memory for the purpose of operation of the phase locked loop. In such an embodiment, assuming that a broadcasting frequency in the FM band is selected through selection of the data stored in the address MEM2 in the FM memory region 29a as a result of selection of channel number 2 in the preset station selecting mode and then the band is switched from the FM band to the AM band, then the broadcasting frequency in the AM band as loaded in the address MEM2 in the AM memory region 29b is not selected but instead the broadcasting frequency in the AM band corresponding to the data stored in the AM scan memory 6b previously selected is again selected.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A frequency synthesizer receiver, comprising:
   first memory means for storing digital value data concerning a broadcasting frequency,
   entry means coupled to said first memory means for selectively entering into said first memory means digital value data concerning a broadcasting frequency,
   second memory means having a plurality of storing locations, each adapted for storing digital value data concerning a specified broadcasting frequency,
   write enable means for said second memory means for selectively entering into said second memory means digital value data from said first memory means concerning a broadcasting frequency,
   station selecting means operatively coupled to said second memory means for selecting one of said plurality of storing locations in said second memory means, said second memory means being responsive to said station selecting means and said write enable means for loading the digital value data which is entered into said first memory means in the location of said second memory means selected by said station selecting means, local oscillating means responsive to the digital value data stored in either of said first and second memory means for providing an oscillation frequency signal the frequency of which is associated with said digital value data stored in said first and second memory means and means for selectively and operatively coupling the output of either of said first and second memory means directly to said local oscillating means.

2. A frequency synthesizer receiver in accordance with claim 1, wherein said memory selecting means comprises means responsive to operation of said entry means for clearing said station selecting means, whereby said first memory means is selected responsive to operation of said entry means.

3. A frequency synthesizer receiver in accordance with claim 1, which further comprises means responsive to said station selecting means for generating a load enable signal to said first memory means for storing the digital value data in the location in said second memory means selected by said station selecting means into said first memory means.

4. A frequency synthesizer receiver in accordance with claim 1, wherein said first memory means comprises a non-volatile memory.

5. A frequency synthesizer receiver in accordance with claim 1, wherein said second memory means comprises a non-volatile memory.

6. A frequency synthesizer receiver comprising:

first non-volatile memory means for storing digital value data concerning a broadcasting frequency, entry means coupled to said first memory means for selectively entering digital value data concerning a broadcasting frequency, second non-volatile memory means having a plurality of storing locations, each adapted for storing digital value data concerning a specified broadcasting frequency, station selecting means operatively coupled to said second memory means for selecting one of said plurality of storing locations in said second memory means, memory selecting means for selecting either of said first and second memory means, means for writing the data stored in said first memory means into the location in said second memory means selected by said station selecting means, and local oscillating means selectively and operatively coupled to either of said first and second memory means by said memory selecting means for providing an oscillation frequency signal the frequency of which is associated with the digital value data stored in said selected memory means, said oscillating means comprising voltage controlled oscillating means for providing an oscillation frequency signal the oscillation frequency of which is variable as a function of a given control voltage, means for modifying the oscillation frequency of the output from said voltage controlled oscillating means, means operatively coupled to receive the digital value output of the selected first or second said memory means for controlling the rate of frequency modification of said oscillation frequency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said oscillating means is adapted to provide an oscillation frequency signal the frequency of which is associated with frequency modification rate, as controlled by said frequency modification rate controlling means.

7. A frequency synthesizer receiver, comprising:

first memory means for storing digital value data concerning a broadcasting frequency, entry means coupled to said first memory means for selectively entering into said first memory means digital value data concerning a broadcasting frequency, second memory means having a plurality of storing locations, each adapted for storing digital value data concerning a specified broadcasting frequency, write enable means for said second memory means for selectively entering into said second memory means digital value data from said first memory means concerning a broadcasting frequency, station selecting means operatively coupled to said second memory means for selecting one of said plurality of storing locations in said second memory means, said second memory means being responsive to said station selecting means and said write enable means for loading the digital value data which is entered in said first memory means in the location of said second memory means selected by said station selecting means, local oscillating means responsive to the digital value data stored in either of said first and second memory means for providing an oscillation frequency signal the frequency of which is associated with the digital value data stored in said selected memory means, means for selectively and operatively coupling the output of either of said first and second memory means directly to said local oscillating means, said oscillating means comprising voltage controlled oscillating means for providing an oscillation frequency signal the oscillation frequency of which is variable as a function of a given control voltage, means for modifying the oscillation frequency of the output from said voltage controlled oscillating means, means operatively coupled to receive the digital value output of the selected first or second said memory means for controlling the rate of frequency modification of said oscillation freqency modifying means, and means responsive to the output from said oscillation frequency modifying means, as modified at the frequency modification rate controlled by said frequency modification rate controlling means, for providing a control voltage associated with the frequency of the output from said oscillation frequency modifying means to said voltage controlled oscillating means, whereby said oscillating means is adapted to provide an oscillation frequency signal the frequency of which is associated with the frequency modification rate, as controlled by said frequency modification rate controlling means.

8. A frequency synthesizer receiver in accordance with claim 7, wherein said memory selecting means comprises means responsive to operation of said entry means for clearing said station selecting means, whereby said first memory means is selected responsive to operation of said entry means.

9. A frequency synthesizer receiver in accordance with claim 7, further comprising means responsive to said station selecting means for generating a load enable signal to said first memory means for storing the digital value data in the location in said second memory means selected by said station selecting means into said first memory means.

10. A frequency synthesizer receiver as in claim 7, wherein said first memory means comprises a non-volatile memory.

11. A frequency synthesizer as in claim 7 wherein said second memory means comprises a non-volatile memory.

12. A frequency synthesizer, comprising:
first memory means for storing digital value data concerning a broadcasting frequency,
entry means coupled to said first memory means for selectively entering into said first memory means digital value data concerning a broadcasting frequency,
second memory means having a plurality of storing locations, each adapted for storing digital value data concerning a specified broadcasting frequency,
write enable means for said second memory means for selectively entering into said second memory means digital value data from said first memory means concerning a broadcasting fequency,
station selecting means operatively coupled to said second memory means for selecting one of said plurality of storing locations in said second memory means,
said second memory means being responsive to said station selecting means and said write enable means for loading the digital value data which is entered in said first memory means in the location of said second memory means selected by said station selecting means,
local oscillating means responsive to the digital value data stored in either of said first and second memory means for providing an oscillation frequency signal the frequency of which is associated with the digital value data stored in said selected memory means,
means for selectively and operatively coupling the output either of said first and second memory means directly to said local oscillating means,
said entry means further comprising means for generating a repetitively changeable digital value, said digital value being changeable as a function of time within a predetermined range, said first memory means being coupled to said changeable digital value generating means and responsive to a load enable signal for loading the digital value obtained from said changeable digital value generating means at the timing when said load enable signal is obtained,
means operatively coupled to said changeable digital value generating means for providing to said first memory means a load enable signal in synchronism with and at a predetermined phase time of the repetitive change of said changeable digital value, and
means operatively coupled to said load enable signal providing means for adjusting the timing of said load enable signal, whereby a digital value obtainable from said changeable digital value generating means at the timing as adjusted by said adjusting means, is loaded in said memory means responsive to the load enable signal obtained at the timing, as adjusted by said adjusting means.

13. A frequency synthesizer receiver in accordance with claim 12, wherein said changeable digital value generating means comprises
means for generating clock pulses, and
means responsive to said clock pulse generating means for counting the number of clock pulses.

14. A frequency synthesizer receiver in accordance with claim 12, wherein said load enable signal providing means comprises
means responsive to said changeable digital value generating means for generating a ramp signal in synchronism with the repetitive change of said changeable digital value, said ramp signal having a wave form changeable as a function of time in synchronism with the repetitive change of said changeable digital value,
means for generating a reference signal having a reference potential to be compared with said ramp signal, and
means operatively coupled to said ramp signal generating means and said reference signal generating means for comparing said ramp signal and said reference signal for providing a load enable signal whenever both coincide with each other.

15. A frequency synthesizer receiver in accordance with claim 14, wherein said adjusting means comprises means for changing the timing where said ramp signal and said reference signal concide with each other.

16. A frequency synthesizer receiver in accordance with claim 15, wherein said timing changing means comprises means for changing the value of said reference potential of said reference signal.

17. A frequency synthesizer receiver in accordance with claim 15, wherein said timing changing means comprises means for changing the wave form of said ramp signal.

18. A frequency synthesizer receiver in accordance with claim 14, wherein said ramp signal generating means comprises a saw-tooth wave generator for generating a saw-tooth wave signal.

19. A frequency synthesizer receiver in accordance with claim 12, which further comprises means for preventing a load enable signal from being applied to said first memory means after the digital value is loaded responsive to the load enable signal.

20. A frequency synthesizer receiver in accordance with claim 19, wherein said preventing means comprises
touch switch means, and means responsive to said touch switch means for allowing a load enable signal to be applied to said first memory means.

21. A frequency synthesizer, comprising:

first memory means for storing digital value data concerning a broadcasting frequency, entry means coupled to said first memory means for selectively entering into said first memory means digital value data concerning a broadcasting frequency, second memory means having a plurality of storing locations, each adapted for storing digital value data concerning a specified broadcast frequency, write enable means for said second memory means for selectively entering into said second memory means digital value data from said first memory means concerning a broadcasting frequency, station selecting means operatively coupled to said second memory means for selecting one of said plurality of storing locations in said second memory means, said second memory means being responsive to said station selecting means and daid write enable means for loading the digital value data which is loaded into said first memory means in the location of said second memory means selected by said station selecting means, local oscillating means responsive to the digital value data stored in either of said first and second memory means for providing an oscillation frequency signal the frequency of which is associated with said digital value stored in said first and second memory means, said first memory means comprising a plurality of first memory means each allotted for a frequency band, said second memory means formed with a plurality of locations each location comprises a plurality of regions each allotted for a frequency band, means operatively coupled to said first and second memory means for selecting a desired frequency and out of a plurality of frequency bands, and means for selecting and operatively coupling the output of either of such first and second memory means to said local oscillating means.

* * * * *